United States Patent [19]
Peterson

[11] Patent Number: 6,126,376
[45] Date of Patent: Oct. 3, 2000

[54] QUICK CHANGE STACKED TUBE FEEDER

[75] Inventor: James R. Peterson, Garland, Tex.

[73] Assignee: Component Express Corporation, Richardson, Tex.

[21] Appl. No.: 09/016,290

[22] Filed: Jan. 30, 1998

[51] Int. Cl.[7] .................................................. B65B 69/00
[52] U.S. Cl. .............................................. 414/403; 29/809
[58] Field of Search ..................... 414/403, 413, 414/416, 798.9; 29/741, 809

[56] References Cited

U.S. PATENT DOCUMENTS

| | | | |
|---|---|---|---|
| 4,599,026 | 7/1986 | Feiber et al ............................ | 29/809 X |
| 4,636,126 | 1/1987 | Spotts ................................... | 414/782 X |
| 4,733,459 | 3/1988 | Tateno ...................................... | 29/741 |
| 5,702,224 | 12/1997 | Kubota ..................................... | 414/403 |

*Primary Examiner*—Janice L. Krizek

[57] ABSTRACT

The invention is a stacked tube component feeder with changeable parts to accommodate different size components. A feed station, including a channel, is mounted on a base. The feed station includes a slot for holding component tubes. A changeable component track is mounted in the channel, and a singulator is mounted on the component track to prevent the feeding of more than one component at a time to a changeable component nest. A removable nest is mounted on the base for receiving components from the removable component track, and transports the component between first and second positions on the base.

15 Claims, 13 Drawing Sheets

QUICK CHANGE STACKED TUBE FEEDER

FIELD OF THE INVENTION

This invention relates to component feeders, and more particularly to a stacked tube feeder having quick change tracks for changing feeder tracks for different size components.

BACKGROUND OF THE INVENTION

In the manufacturing of circuit board assemblies, the placement of the circuit components is automated in that a component is fed from a tube feeder holding the components. A component feeder removes the components from a tube, one at a time, and moves them to a pick station where the component is moved by a picker device to the circuit board on which the component is to be mounted. Only one type of component can be handled by the component feeder at a time. To feed a different type of component, another type or size of tube feeder must be used.

SUMMARY OF THE INVENTION

The invention is a stack tube feeder that can be changed to handle different component types by changing out the component feed track and component nest. Components are fed from the bottom tube of a stack of component tubes. When components are picked up by a picker or placement machine, another component is singulated and transported to the pickup position. When the component tube in the feeding position is empty, it automatically drops from the feeder and component feeding continues from the next tube in the stack.

When a different type or size component is desired, two parts, a quick change tracks and component nest, in the component feed path are changed to accommodate the different component. Quick change tracks and nests can be made for most any component, for example, semiconductor devices such as 24 lead PLCC, 32 lead PLCC and 44 lead PLCC devices. Components as large as 12 mm tall by 25 mm wide by 100 mm long can be accommodated in a 40 mm feeder and larger components can be accommodated in larger feeders. With the use of the quick change parts, it is not necessary to have a tube feeder for each different component. Only one set of feeders is needed with a set of changeable parts, a quick change track and component nest, for each component in the setup.

DESCRIPTION OF A PREFERRED EMBODIMENT

Figure 1:
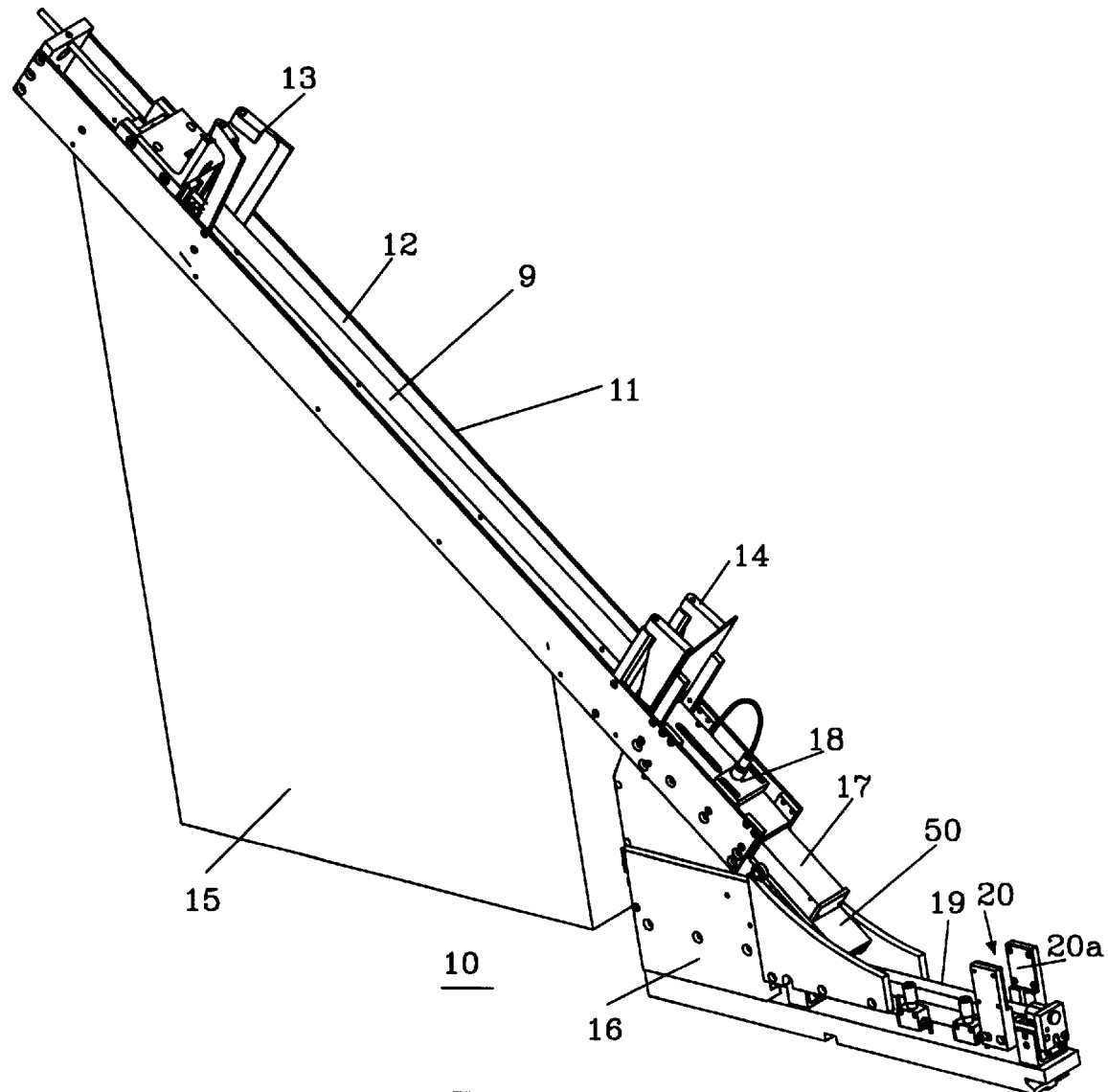
FIG. 1 shows the quick change stacked tube feeder of the present invention.

FIG. 1 shows an assembled quick change stacked tube feeder 10. Feeder 10 includes a base 16 with the component feed section 11 mounted on base 16. Component feed section 11 includes tube track 12 with front tube guides 14 and rear tube guides 13. Receptacle 15, may be for example, a cloth or plastic fabric bag that catches empty component tubes when they are ejected from the bottom of tube track 12. Component tube 9 is shown in tube track 12.

Quick change component track 18 is mounted at the end of tube track 12. Quick change component nest 17 is mounted on shuttle 50. Shuttle 50 moves between a position adjacent to the quick change component track to a position between pickup sensor 20a in pick station 20. A detailed description of the above parts and the function of each is described below with references to the various figures.

Figure 2:
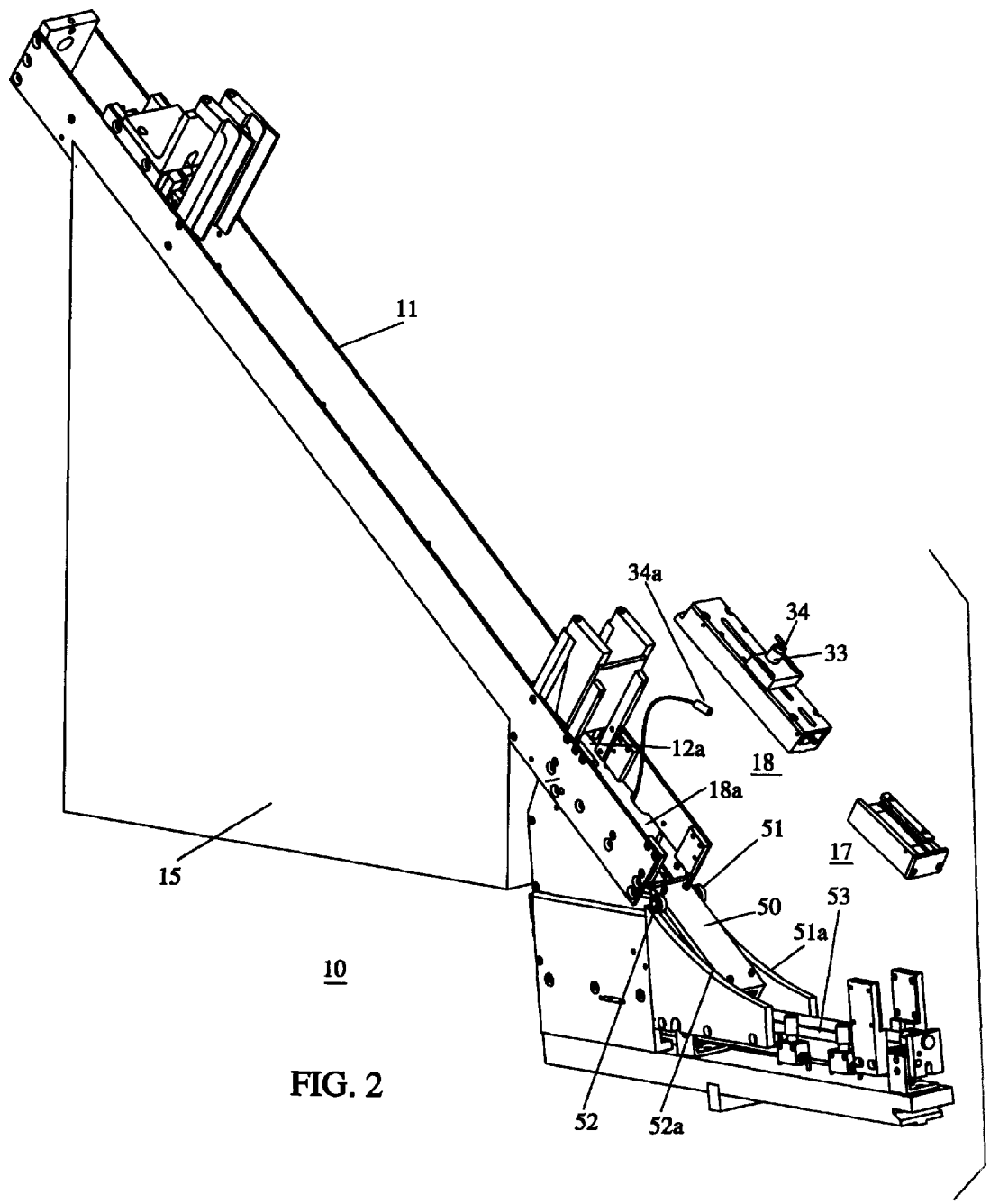
FIG. 2 shows the feeder with the component track and component feeder nest removed.

FIG. 2 is an exploded view of component feeder 10 with the component track 18 and component feeder nest 17 removed. Quick change component track 18 mounts in channel 18a of component feed section 11. Components are gravity fed from component tube 9 though opening 12a into quick change component track 18. Quick change component nest 17 is mounted on shuttle 50 which moves along incline tracks 51a and 52a on wheels 51 and 52 respectively. A quick disconnect air fitting 34a attaches to fitting 34 on singulator cylinder 33. Singulator cylinder 33 is used to prevent more than one component at a time from being fed from the component tube into the nest.

Figure 3:
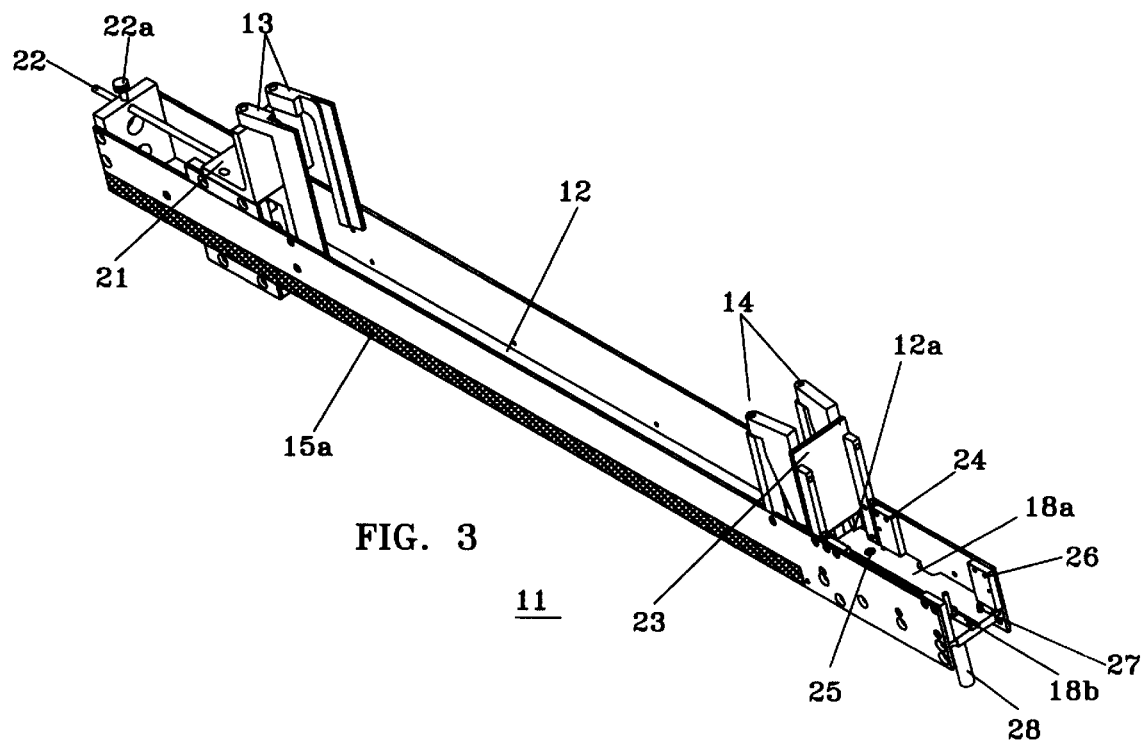
FIG. 3 shows the component feed section.

FIG. 3 shows the feeding section 11 of the stacked component tube feeder 10. A stack of component tubes (not illustrated) are placed in track 12 and held in position side to side by front tube guides 14 and rear tube guides 13. Both tube guides 13, 14 are loaded using Belleville disc springs so that when different size tubes are used, they are pivoted into place to accommodate the width of the loaded tubes, and are held in that position by the spring loading.

Shaft 22 is held in a fixed position by thumb screw 22a. By moving shaft 22 in or out, the length of track 12 is adjusted to accommodate component tubes of various lengths. A strip of hook and loop material 15a, or other fastening means, extends along the outside of track 12 for holding bag 15 (FIGS. 1 and 2) under the feeding section 11 in order to catch ejected empty component tubes. A component tube holding plate 23 is adjacent to tube guides 14. Holding plate 23 prevents stacked component tubes from moving when feeding section 11 is mounted on base 16 in its inclined position. There is an opening 12a below plate 23 to allow components to move from the bottom of the component tube to the quick change track 18 (FIG. 2).

There is a mounting channel 18a in which quick change track 18 is mounted. Mounting channel 18a contains features for aligning and securing track 18 into mounting channel 18a. Alignment track 18b, used to align quick change track 18, is in the bottom of mounting area 18a. Quick change track 18 has a hole in its bottom plate through which locating pin 27 extends when track 18 is in place. Pin 27 accurately locates track 18 in channel 18a. Track 18 is held in place by, for example, holding magnets 25 in the bottom of mounting channel 18a. Other types of holding and alignment devices may be used. In the side wall of channel 18a is a tube eject sensor 24. After the last component from a component tube is moved through track 18, sensor 24 will sense that there is no component, and ejector 21 will eject the component tube into bag 15 allowing another component tube to drop into place for feeding components.

To prevent more than one component at a time from loading into nest 17 and moving to the pick station, a down stream singulator cylinder 28 extends up through the bottom of channel 18a, and extends through quick change track 18. When a component is released by singulator cylinder 28, the next component in line and the components behind that component are held in place and prevented from moving out of the track by singulator cylinder 33 (FIG. 2)

Figure 4:
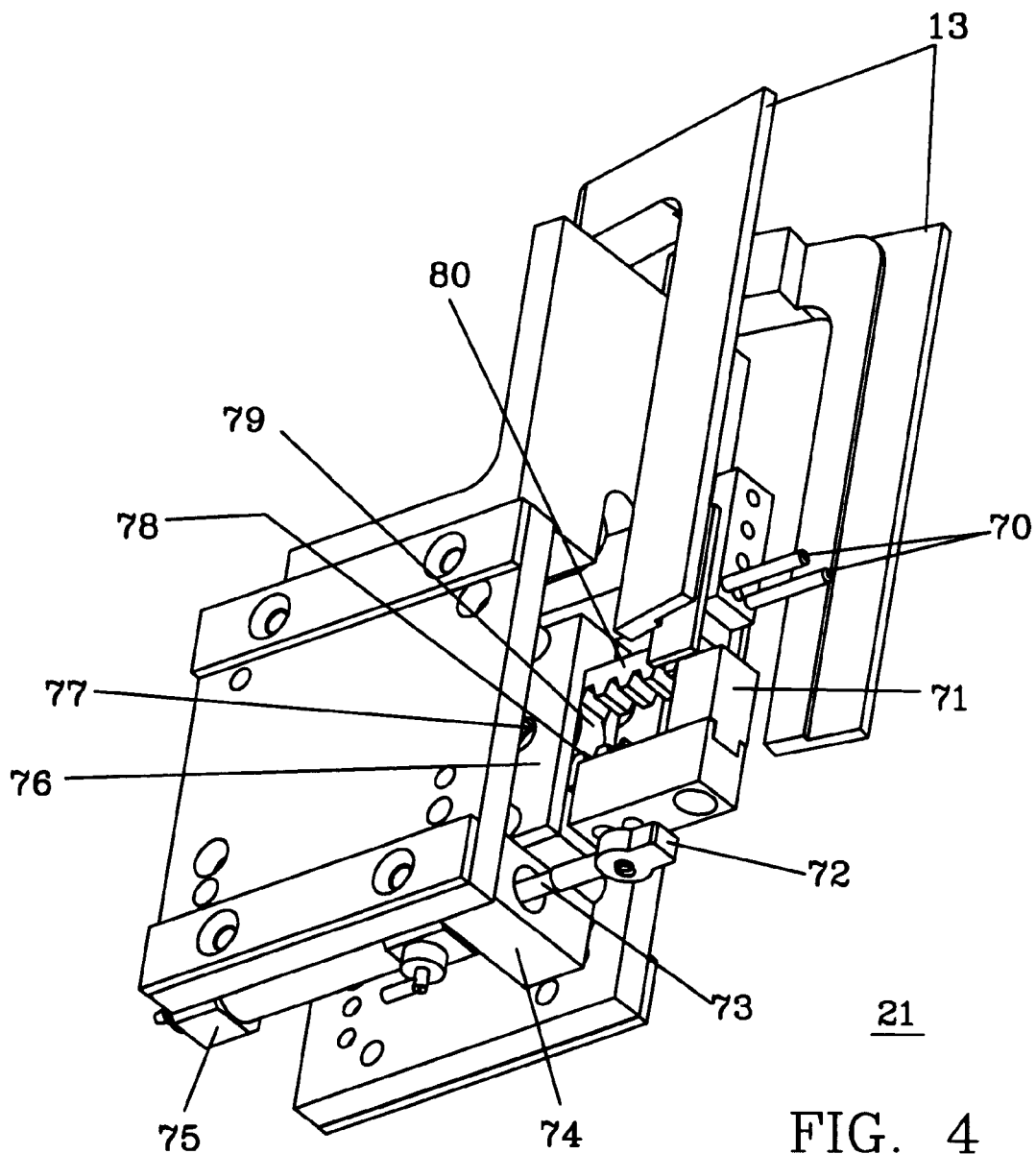
FIG. 4 shows the component tube ejector
Figure 4A:
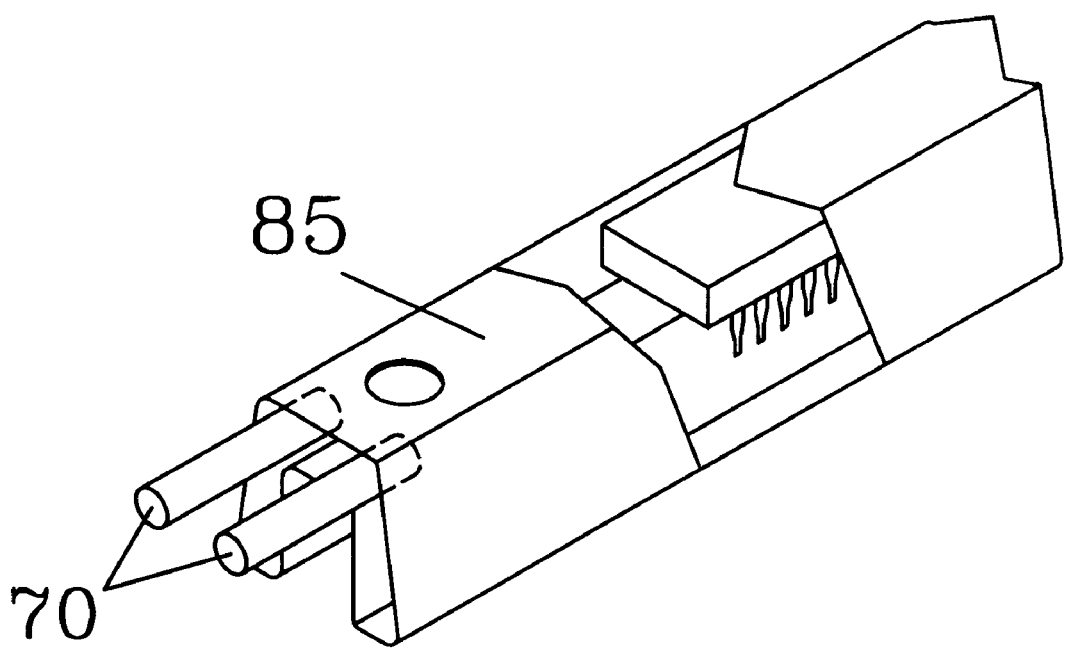
FIG. 4a shows a component tube with holding pins.

FIG. 4 shows the component tube eject mechanism 21 that holds the component tube in place while components are being fed, and ejects empty tubes while preventing the next full component tube from being dropped while the empty tube is ejected. Rear tube guides 13 are mounted on eject mechanism 21, and are on each side of tube support 71. Tube support 71 supports a component tube in place while components are being removed from the component tube. Above tube support 71 are two pins 70 which are inserted into the component tube above the component tube from which components are being fed. FIG. 4a shows pins 70 inserted into the end of component tube 85, showing how the end of component tube 85 is supported to prevent it from being ejected with an empty component tube.

Tube support 71 is attached to cylinder shaft 73 by rod end 72. Shaft 73 is a part of air cylinder 75 which is used to activate and move tube support 71 and pins 70. The eject mechanism includes a rack and pinion housing 76 which houses lower rack gear 78, upper rack gear 80, and pinion gear 79 mounted by pin 77. Eject mechanism operates as follows. Upon detection of an empty component tube by sensor 24 (FIG. 3), air cylinder 75 will be actuated, pulling tube support 71 from under a component tube. When tube support 71 is moved from under a component tube, rack gear 78 will turn pinion gear 79 moving rack gear 80 and pins 70 into a component tube above the empty tube that is to be ejected. Rear tube guides 13 center the tube so that the pins 70 can enter into the tube. Pins 70 prevent the full tube from also being ejected. Upon ejecting the empty tube, air cylinder 75 will move tube support 71 back into position and withdrawing pins 70 from the end of the next full component tube to provide support for the next full tube.

FIG. 4a shows an example of a component tube 85 with pins 70 inserted in one end to prevent component tube 85 from being ejected while an empty tube below it is ejected.

Figure 5:
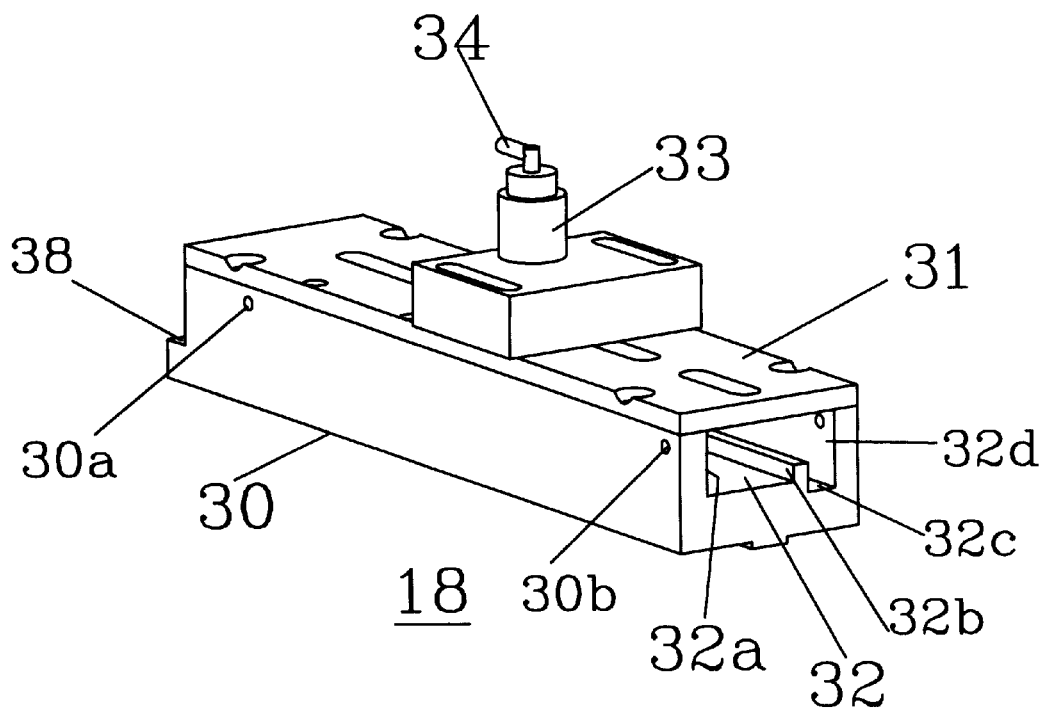
FIG. 5 shows a first view of the component feed track.
Figure 6:
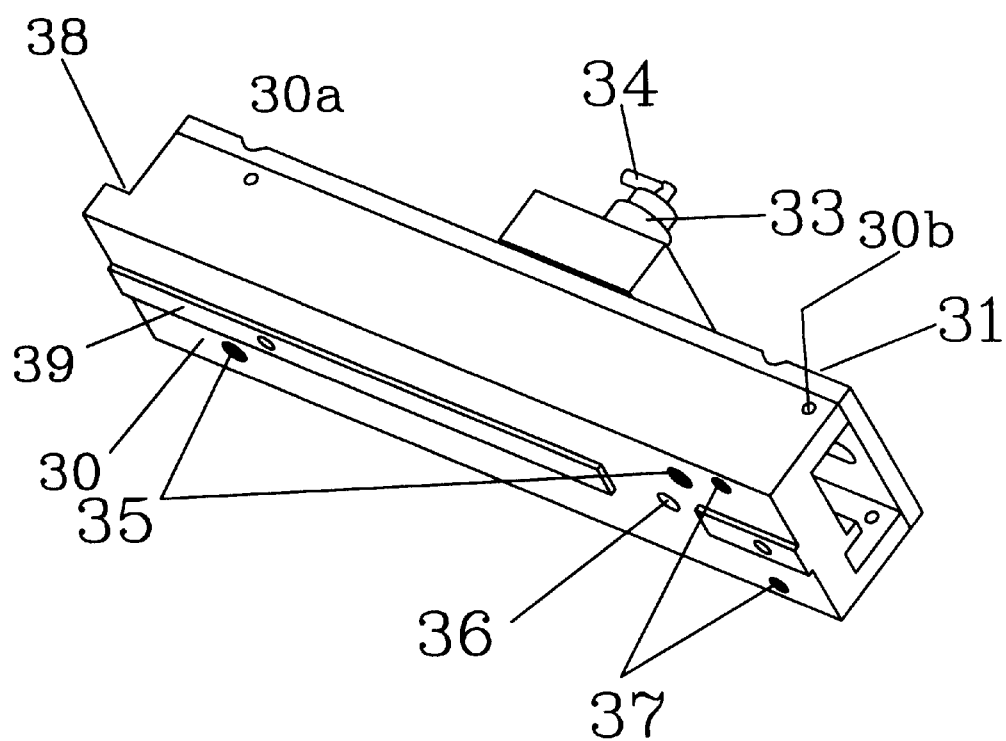
FIG. 6 shows a second view of the component feed track.

FIG. 5 and FIG. 6 show the quick change track from two different views. FIG. 5 shows the side and end of base 30, and top plate 31. Component track 32 extends the length of base 30 and is the path on which a component slides through track 18. The component is also guided and contained by guide surfaces 32a, 32b, 32c, 32d, and top plate 31. Track 32 and guide surfaces 32a, 32b, 32c and 32d are of a different sizes and shapes for different sized and shaped components. To plate 31 also may be of a different shape for different size and shaped components. The up stream singulator cylinder 33 is mounted on top plate 31, and extends to track 32, and when actuated, singulator 33 blocks track 32 and prevents a component from moving past singulator 33. Singulator cylinder 33 may be positioned in a different location for components of a different size and shape Singulator 33 has a quick disconnect air fitting 34. Track 39, on the bottom of base 30, is used to align component track 18 in alignment track 18b (FIG. 3)in the bottom of mounting area 18a. Ledge 38 supports the end of the component tube from which components are being taken, and provides the proper height to align the component tube relative to component track 32. Ledge 38 may be different for different size components and component tubes. Openings 30a and 30b are used by a photo sensors 24 and 26 to indicate when components are in component track 18. Sensor 24 and opening 30a are used in conjunction with the tube eject mechanism. When the component tube is empty, the empty component tube will be ejected. Sensor 26 and opening 30b are used to detect when a component has moved from the component track 18 to the component nest 17 so that the component can be transported in the nest to the pickup station.

FIG. 6 shows the bottom of base 30. There are two holes 37 for receiving locating pins 27 (one pin 27 shown in FIG. 3) which locate track 18 in opening 18a. There are two steel inserts 35 in the bottom 30 of track 18. Inserts 35 correspond to the track holding magnets 25 (one shown in FIG. 3) to hold track 18 in place yet allow a quick removal of track 18 when a track for a different size component is required. Alignment track 39 is shown on the bottom of component track 18. Alignment track 39 or alignment pins may be used. Both are not necessary. Ledge 38 is shown extended out from the bottom of component track 18.

Figure 7:
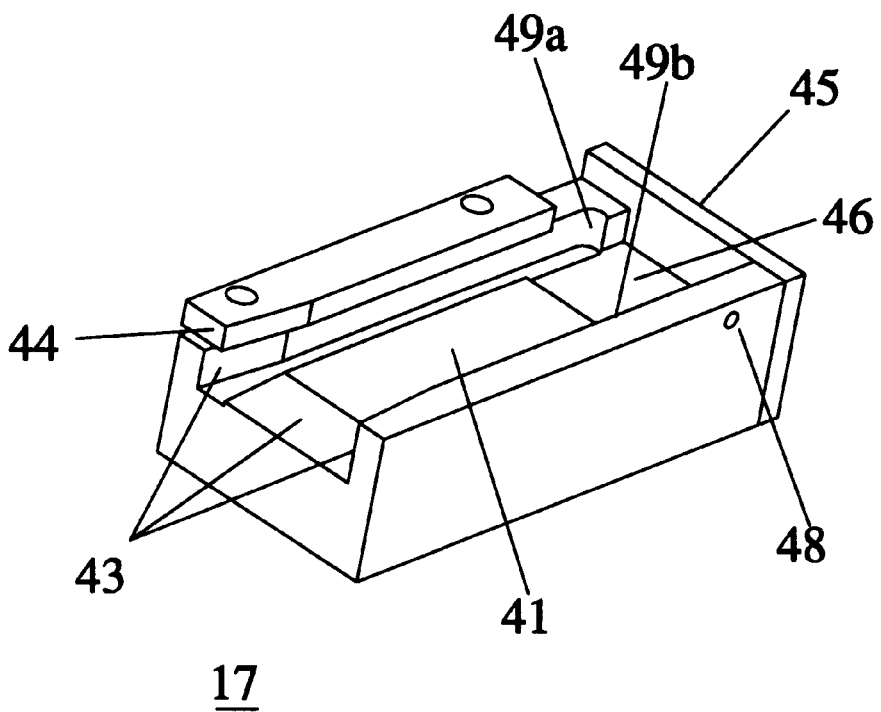
FIGS. 7 and 7a show the component feeder nest.
Figure 7A:
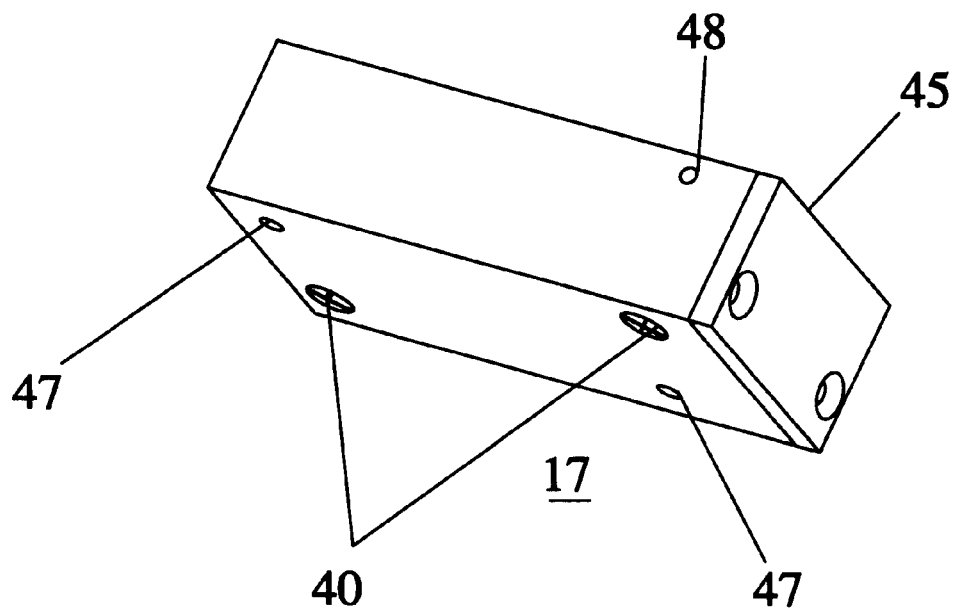

FIGS. 7 and 7a show the component feeder nest 17. Feeder nest 17 receives a component from track 18 and moves the component to a pickup station. A component from track 18 moves onto surface 41 and is guided into depression 46 in nest 17 by guide 44, tapered surfaces 43, and guides 49a, 49b. When a component slides into nest 17, nest 17 is slanted upward and the momentum of movement of the component carries the component against the stop end 45 and into depression 46. Depression 46 is lower than surface 41 and holds the component in place as shuttle 50 accelerates down ramp 51a, 51b and moves to the pick station 20. Tapered surfaces 43, guide 44, surface 41, depression 46, end stop 45, and guiding surfaces 49a, 49b are of a different size and shape for different size and shaped components.

Feeder nest 17 is a quick change part so that it may be lifted from its mount easily, and replaced by another quick change nest for another type or size component. Component nest 17 is aligned by pins in alignment holes 47 and held in place by magnets 40. Hole 48 is for pickup sensor 20a (FIG. 1) sensor to look through and to detect when a component is or is not in the pickup position depression 46, of the component nest when the nest is in pick station 20 (FIG. 1).

Figure 8:
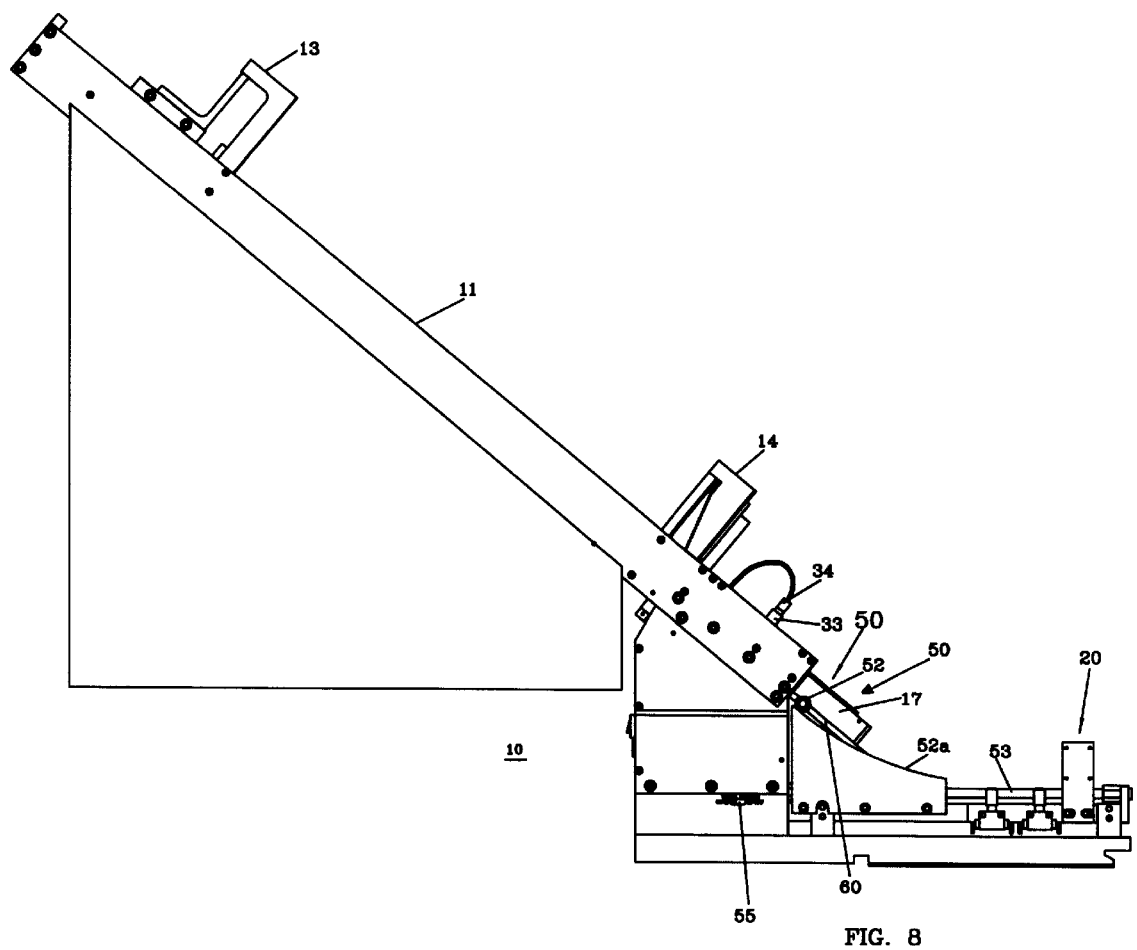
FIG. 8 shows component feeder nest at the component load position.

FIG. 8 is a side view of the quick change stacked tube feeder 10 with the component feeder nest 17 in the load position. A component is moved from a component tube through track 18 into feeder nest 17. A single component is loaded into the nest at a time. Singulators 33 and 28 (FIG. 3) prevent more than one component at a time from moving through track 18 into feeder nest 17. Component nest 17 is mounted on a block 60 with wheels 51 and 52 which ride on cam surface tracks 51a and 52a.

Figure 9:
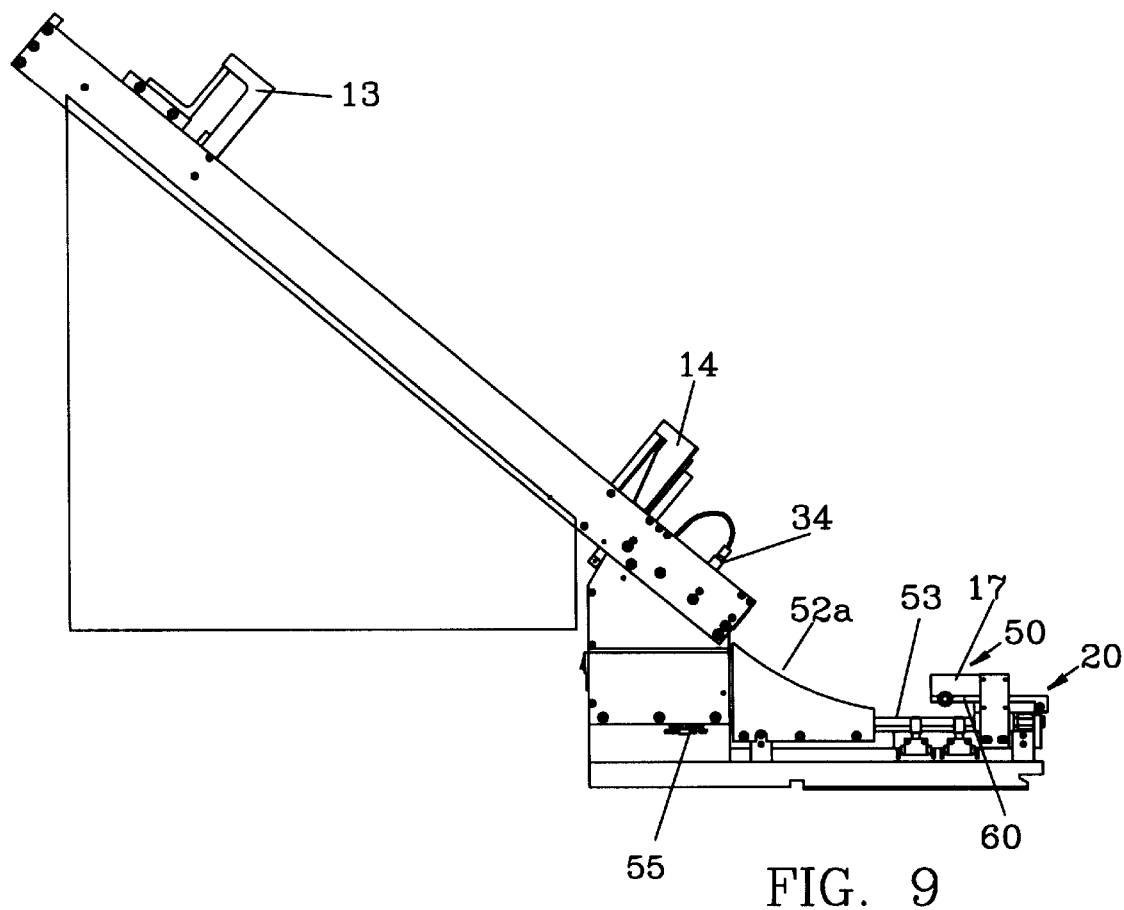
FIG. 9 shows the component feeder nest at the component pick position.

FIG. 9 is a side view of the quick change stacked tube feeder 10 with the component feeder nest 17 in the unload position. Block 60, with feeder nest 17 mounted thereon, has moved down cam surface 52a and 51a (FIG. 2) to pick station 20. At this point the component is removed by a pick device (not illustrated), and shuttle 50 and feeder nest 17 is moved back up cam surface tracks 51a and 52a to a position adjacent to feeder track 18 to received another component.

Figure 10:
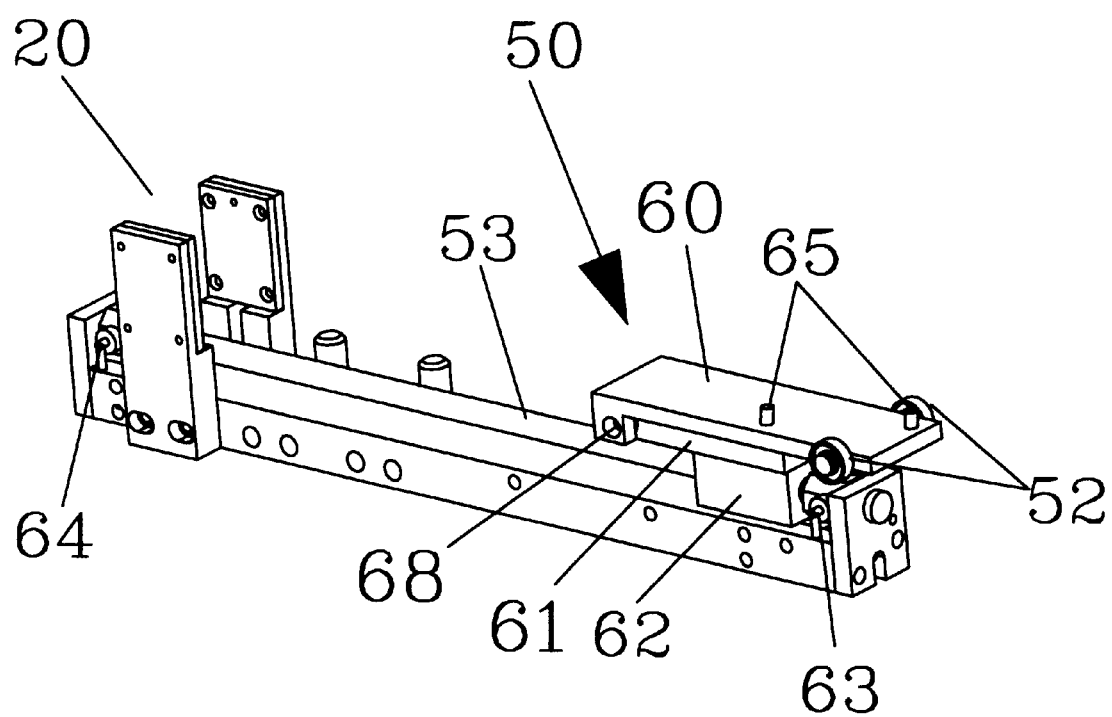
FIG. 10 shows the shuttle track.

FIG. 10 is a more detailed view of shuttle 50 and related components that moves the component nest 17 between load and pick positions. Shuttle 50 includes mounting block 60 which is pivotally mounted on plate 61 by shaft 68. Plate 61 is mounted on rodless cylinder shuttle block 62 which is moved back and forth on rodless cylinder tube 53. Component nest 17 is mounted on block 60 by pins 65 in block 60. By alternately introducing air into air inputs 63 and 64, cylinder shuttle block 62 is moved from one end to the other of cylinder tube 53. After a component is loaded into component nest 17, shuttle 50 moves component nest 17 to pick station 20. After the component is removed at pick station 20, (FIG. 9) component nest 17 is moved adjacent to track 18, as illustrated in FIG. 8. Typical shuttle carriers utilizing rodless cylinders are manufactured by SMC Corporation, designated as Air Cylinder NCY2 Series.

Figure 11:
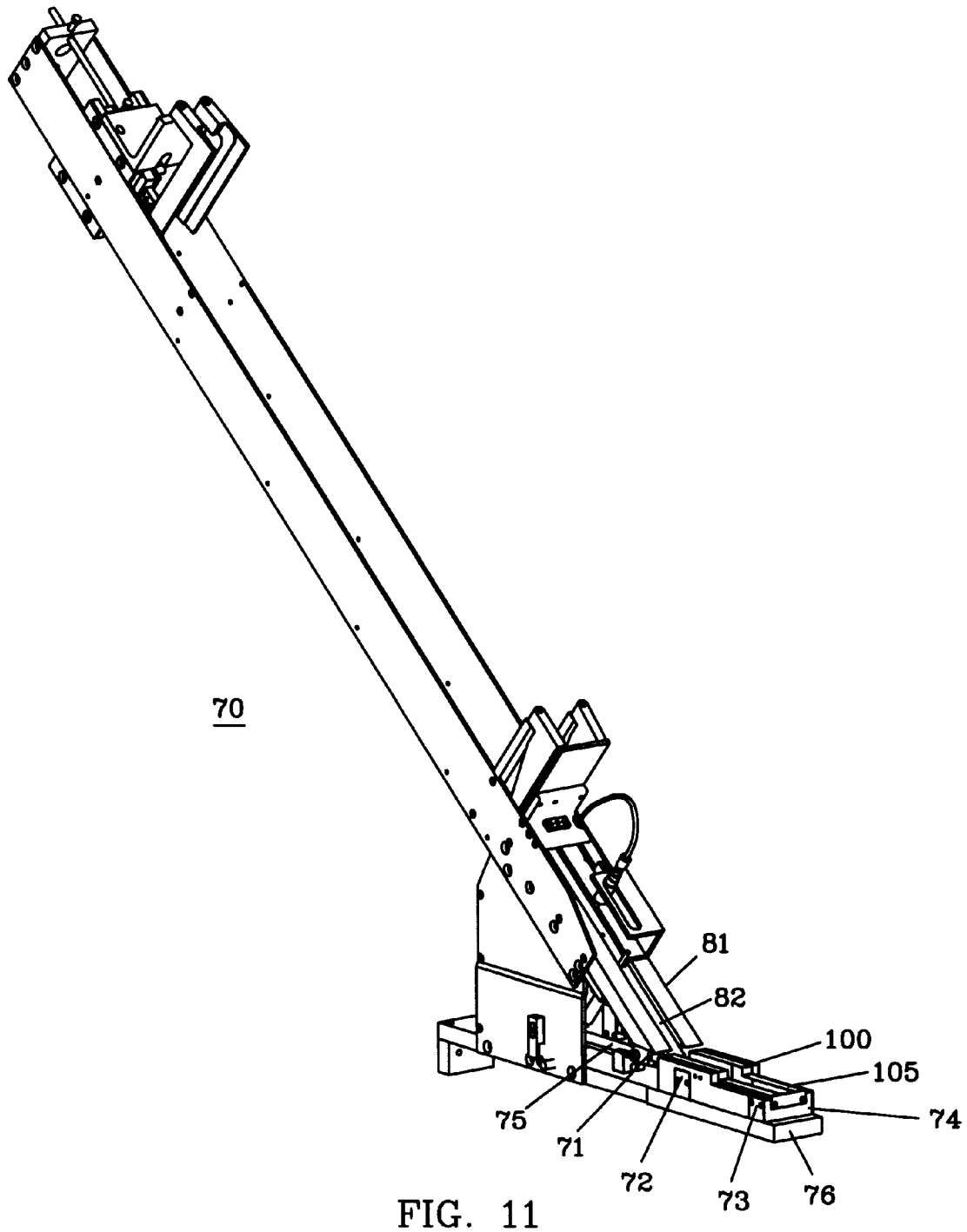
FIG. 11 shows a second embodiment of the invention.

FIG. 11 illustrates a second embodiment of the quick change feeder in which a sloped track 81 moves a component in to a horizontal nest. A push rod is used to move the component from its location at one end of the horizontal track to a pick-up station. Feeder 70 has sloped track 81 and horizontal nest 100. Sloped track 81 is mounted in the opening, for example, the opening 18a shown in FIG. 2. Component track 82 in sloped track 81 aligns with a component tube and receives components. Singulator 85 prevents more than one component from being fed at a time. A component slides down track 82 into horizontal nest 100. Push cylinder 70 pushes the component to pickup point 105 after it is sensed by track loaded sensor 72. The component is then picked up by a component picker (not illustrated) when pickup point sensor 73 indicates that there is a component at pickup point 105. Tube ejector sensor 74 indicates when there are no more components in the component track, by the absence of a component.

Figure 12:
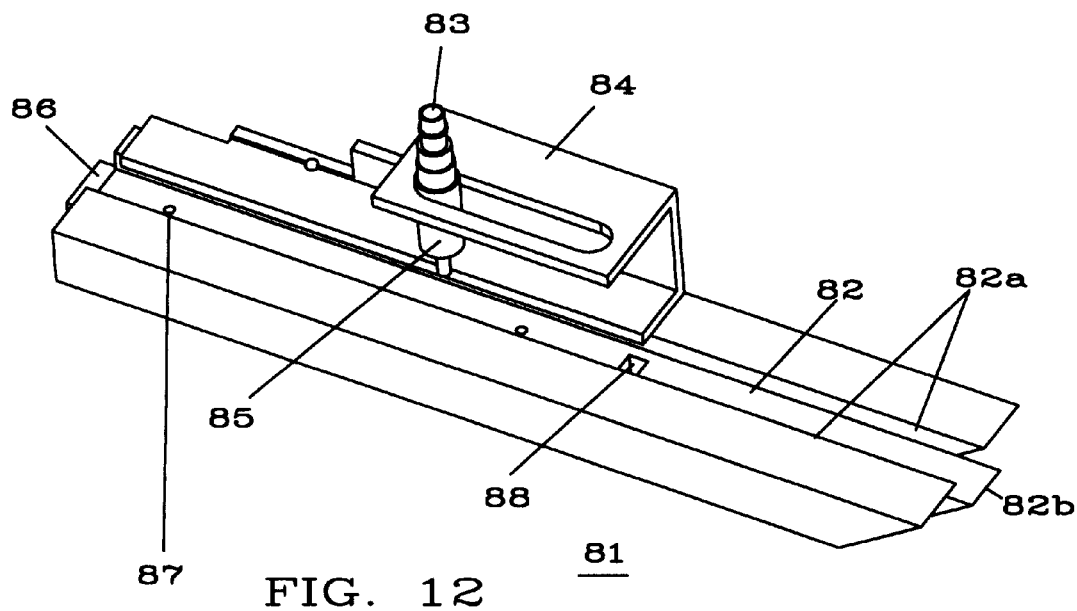
FIGS. 12 and 13 show two views of the sloped track of the second embodiment.
Figure 13:
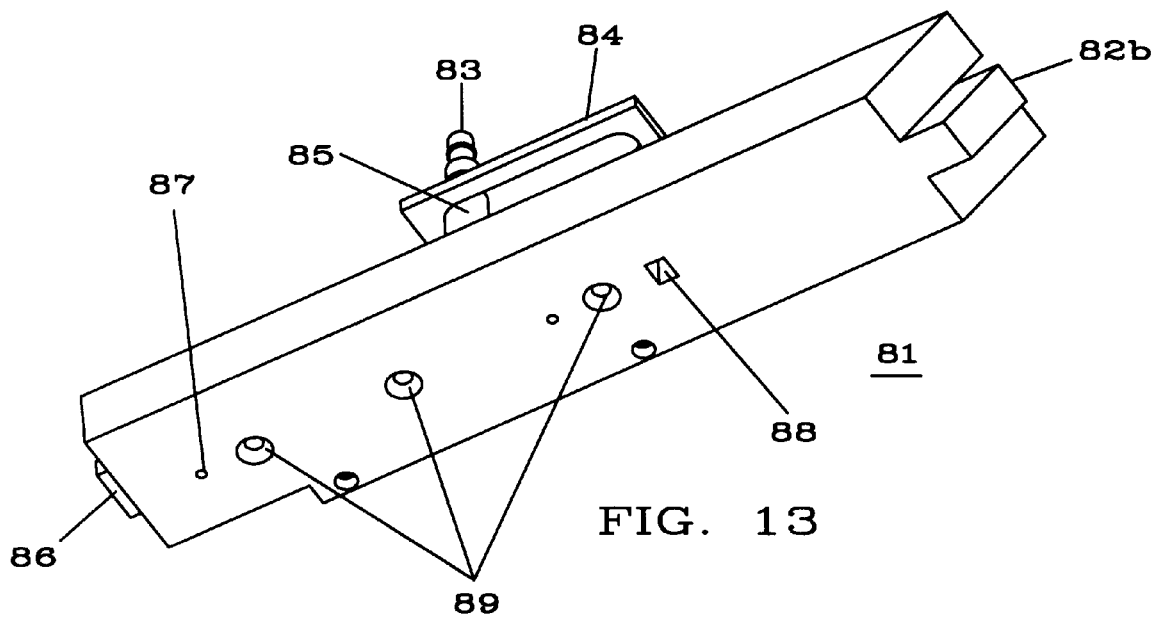

FIGS. 12 and 13 show the quick change sloped track 81. FIG. 12 shows the top of sloped track 81 on which singulator air cylinder 85 is mounted in bracket 84. A quick disconnect air fitting 83 is mounted on singulator air cylinder 85. Track 82, and guide surfaces 82a, extend from ledge 86 on which the end of a component tube rests to end 82b. Opening 87 is a viewing path for the tube eject sensor. Opening 88 is for lower singulator shaft (singulator 28, FIG. 3). The up stream singular is shown as 85. The lower flange of bracket 84 also serves as a track cover.

FIG. 13 shows the bottom of sloped track 81. In addition to opening 87 for the tube eject sensor, and opening 88 for the lower singular shaft, three openings 89 are shown. Openings 89 are for magnets for removably attaching sloped track 81 in opening 18a (FIG. 2). Surface 82, bracket 84, and ledge 86 will be of a different size and shape for different sizes and shaped components.

Figure 14:
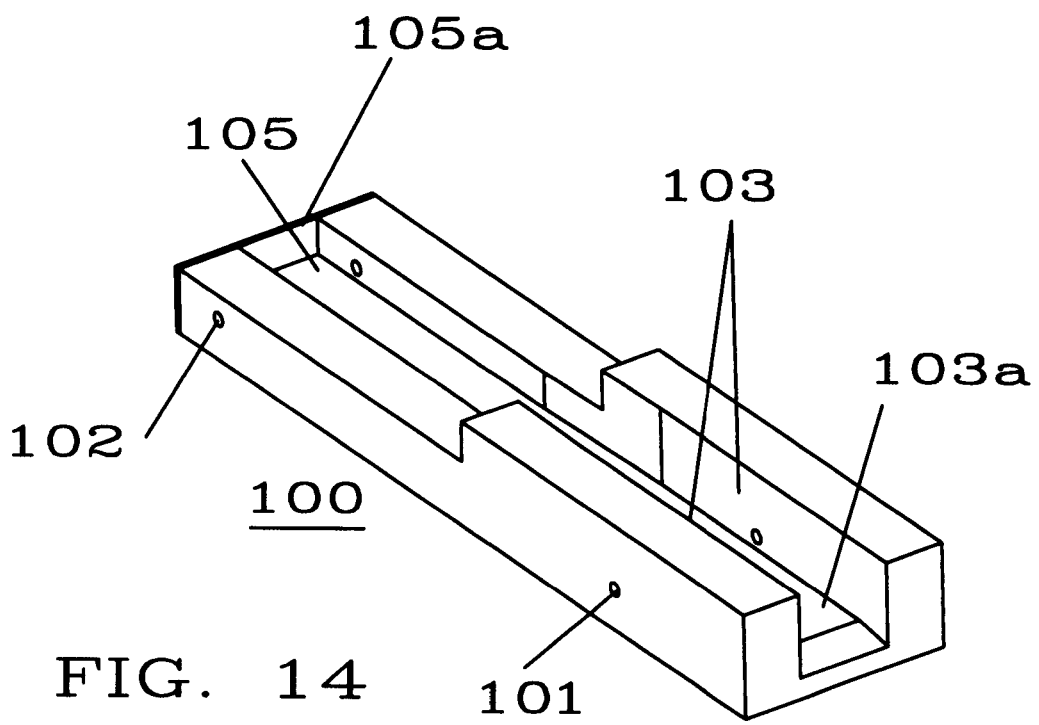
FIGS. 14 and 15 show two views of the horizontal nest of the second embodiment.
Figure 15:
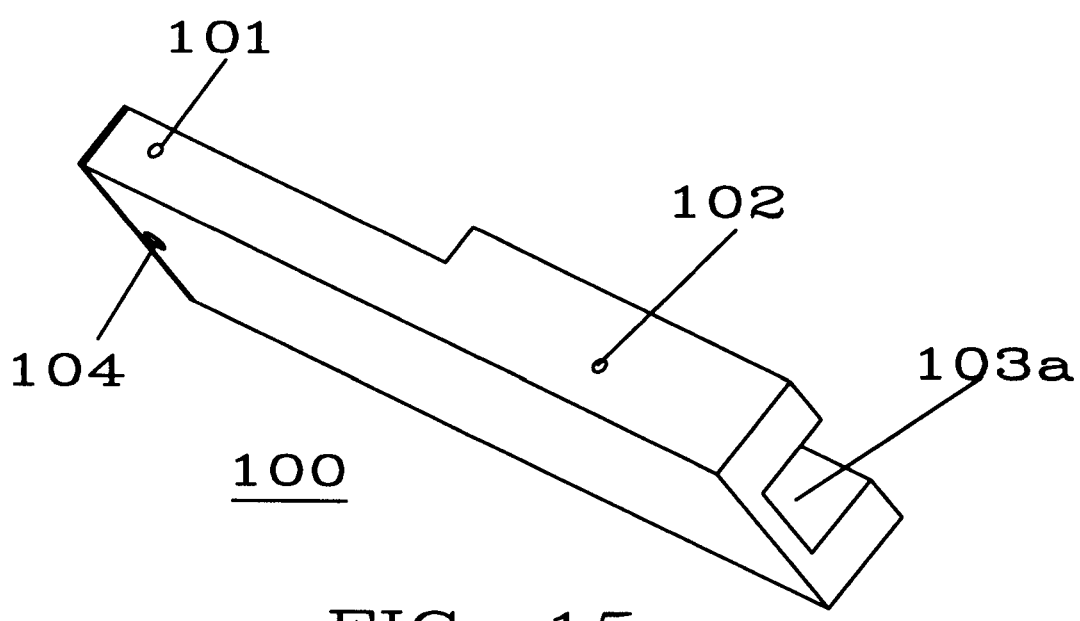

FIGS. 14 and 15 illustrate the horizontal track 100. Track 100 has opening 101 through which a sensor determines when a component has been loaded into component track 103. Opening 102 is used with a sensor to determine when a component is at the component pickup point 105, adjacent to stop 105a. It should be noted that end 103 a of track 100 is open so that a push rod 75 (FIG. 11) can move a component that slides down sloped track 81 into end 103a of horizontal track 100 to component pickup end 105. There is at least one opening 104 for receiving a pin, not illustrated, on base 74 (FIG. 11) Horizontal track 100 may be of a ferrous material so that it may be held in place by a magnets, or inserts similar to the inserts 98 may be in the bottom of track 100 to hold it on base 74. Component track 103, guide surfaces 103a, and stop 105a may be of different sizes and shapes for different sized and shaped components.

In the configuration of FIG. 3, a sensor 24 views horizontally across the component track. A sensor in either the feeder of FIG. 3 or the feeder of FIG. 11 may view horizontally or vertically. In the configuration of FIG. 11, there is not a sensor at the end of the sloped track such as sensor 26 of FIG. 3. Rather, there is a sensor at the beginning of the horizontal track 100 which has two functions.

While push rod 75 is extended, it's shaft blocks the optical sensor path through sensor opening 101. When the component at the pickput point 105 is picked by a placement machine (not illustrated), the pickup point sensor viewing through opening 102 detects that the component is gone. As soon as the push rod 75 has retracted beyond the sensor viewing opening 102, the feeder "knows" that the component has been picked, that the push rod has been retracted, and it is safe for singulators 85 and 28 (FIG. 3) to release a component to slide down sloped track 81 into horizontal track 100.

A second function of the track load sensor viewing through opening 102 is to detect when a component has entered end 103a. The system then knows that it is time to extend push cylinder 70 to push the component to pickup point 105.

The invention has been described with a removable track and component nest that are located and held in place with dowel pins and magnets. Other means to locate and hold the track and nest in place can be used. Examples are spring plungers, ball detents, latches and thumb screws, key slots and ridges. All of these fastening and location means provide the capability to provide the quick change features of the invention.

What is claimed:

1. A stacked tube component feeder with changeable parts to accommodate different size components, comprising:
   a base;
   a feed station, including a channel, mounted on said base, and guides for holding a plurality of component tubes;
   a changeable component track mountable in said channel;
   a changeable component nest; and
   a transport device mounted on said base for sliding the component nest between first and second positions;
   wherein said channel in said feed station includes at least one magnet for holding said changeable component track in said channel.

2. The feeder according to claim 1, including a singulator on said changeable component track for allowing only one component at a time to move from said component track.

3. The feeder according to claim 2, wherein said singulator has a quick connect connector to connect the singulator on the component track to an air supply.

4. The feeder according to claim 1, including a singulator in said channel in which said component track is mounted.

5. The feeder according to claim 1, including a sensor viewing across the component track to indicate when a component tube is empty.

6. The feeder according to claim 1, including at least one alignment pin in said channel for positioning said component track in said channel.

7. The feeder according to claim 1, wherein said component track has and opening therein for receiving an alignment pin.

8. The feeder according to claim 1, wherein said component nest is retained on said transport device by a magnet.

9. A stacked tube component feeder with changeable parts to accommodate different size components, comprising:
   a base;
   a feed station, including a channel, mounted on said bases, and guides for holding component tubes;
   a changeable component track mountable in said channel and a singulator mounted on said component track, wherein said channel in said feed station includes at least one magnet for holding said changeable component track in said channel;

a changeable component nest; and a movable shuttle mounted on said base for moving said component nest between first and second spaced apart positions on said base.

10. The feeder according to claim 9, wherein said singulator has a quick connect connector to connect the singulator on the component tract to an air supply.

11. The feeder according to claim 9, including a sensor viewing across the component track to indicate when a component tube is empty.

12. The feeder according to claim 9, including at least one alignment pin in said channel for positioning said component track in said channel.

13. The feeder according to claim 9, wherein said component track has an opening therein for receiving an alignment pin.

14. The feeder according to claim 9, wherein said component nest is retained on said shuttle by a magnet.

15. A stacked tube component feeder with changeable parts to accommodate different size components, comprising:

a base;

a feed station, including a channel, mounted on said base, and guides for holding at least two component tubes;

a changeable component track mountable in said channel;

a changeable component nest;

a movable shuttle mounted on said base for moving said component nest between first and second spaced apart positions on said base; and at least one alignment pin in said channel for positioning said component track in said channel.

* * * * *